United States Patent
Tsuda

(10) Patent No.: US 9,190,980 B2
(45) Date of Patent: Nov. 17, 2015

(54) ELASTIC WAVE FILTER

(75) Inventor: Tadaaki Tsuda, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 454 days.

(21) Appl. No.: 13/415,131

(22) Filed: Mar. 8, 2012

(65) Prior Publication Data
US 2012/0235769 A1 Sep. 20, 2012

(30) Foreign Application Priority Data

Mar. 18, 2011 (JP) ................. 2011-061340

(51) Int. Cl.
*H03H 9/145* (2006.01)
*H03H 9/64* (2006.01)

(52) U.S. Cl.
CPC ....... *H03H 9/14558* (2013.01); *H03H 9/14591* (2013.01); *H03H 9/644* (2013.01); *H03H 9/1455* (2013.01); *H03H 9/14505* (2013.01); *H03H 9/14552* (2013.01); *H03H 9/6459* (2013.01)

(58) Field of Classification Search
CPC ............ H03H 9/1455; H03H 9/14558; H03H 9/14591; H03H 9/6459; H03H 9/644; H03H 9/14505; H03H 9/14552
USPC .......... 333/133, 193, 194, 195, 196; 310/313 A, 313 B, 313 D, 313 R
See application file for complete search history.

(56) References Cited

U.S. PATENT DOCUMENTS

| | | |
|---|---|---|
| 4,494,031 A | 1/1985 | Barnes et al. |
| 6,023,122 A | 2/2000 | Liu et al. |
| 6,476,691 B1 * | 11/2002 | Tsuzuki et al. ............... 333/193 |

FOREIGN PATENT DOCUMENTS

| | | |
|---|---|---|
| CN | 2619413 | 6/2004 |
| FR | 2 524 224 | 9/1983 |
| JP | 49-14093 | 2/1974 |
| JP | 54-844 | 1/1979 |
| JP | 54-4548 | 1/1979 |
| JP | 1-260911 | 10/1989 |
| JP | 2005-102119 | 4/2005 |
| JP | 2006-311180 | 11/2006 |
| JP | 2010-103849 | 5/2010 |

OTHER PUBLICATIONS

Bausk E V et al: "Composite fan-shaped SAW transducers", Microwave Symposium Digest, 1995., IEEE MTT-S International Orlando, FL, USA May 16-20, 1995, New York, NY, USA, IEEE, US May 16, 1995, pp. 1681-1684, XP010612643, DOI: 10.1109/MWSYM.1995. 406301 ISBN: 978-0-7803-2581-4.

* cited by examiner

*Primary Examiner* — Benny Lee
*Assistant Examiner* — Jorge Salazar, Jr.
(74) *Attorney, Agent, or Firm* — Jordan and Hamburg LLP

(57) ABSTRACT

There is provided a tapered elastic wave filter higher in impedance than a conventional filter where one input-side IDT electrode and one output-side IDT electrode are disposed. Filter parts which are the same in the structure of an input-side IDT electrode and in the structure of an output-side IDT electrode are disposed, and when the first filter part is disposed on a lower side and the second filter part is disposed on an upper side of the first filter part so that the input-side IDT electrodes are connected and the output-side IDT electrodes are connected, in cascade (in series) between a signal port and a ground port, an upper busbar in each of the IDT electrodes of the first filter part and a lower busbar in each of the IDT electrodes of the second filter part are electrically connected to each other.

5 Claims, 8 Drawing Sheets

ELASTIC WAVE FILTER

The present application claims priority to foreign patent application no. JP-2011-061340, filed on Mar. 18, 2011.

BACKGROUND OF THE INVENTION

1. Field of the Invention

The present invention relates to an elastic wave filter in which a placement region of a group of electrode fingers is formed in a tapered shape.

2. Description of the Related Art

As a filter using an elastic wave, for example, a surface acoustic wave (bandpass filter), there has been known a structure in which IDT (Inter Digital Transducer) electrodes are disposed on a piezoelectric substrate as an input-side electrode and an output-side electrode, and their regions where many electrode fingers are disposed are each formed in a tapered shape in a region between a pair of busbars. In each of the IDT electrodes, one of the pair of busbars is connected to a signal port (an input port or an output port) and the other one is connected to a ground port or another signal port. Between this filter and an electric circuit or an electronic component outside this filter, a matching circuit is provided in order to reduce an insertion loss of the filter.

In such a tapered filter, impedance tends to be lower than that of an ordinary transversal filter (a filter in which electrode fingers are disposed to be perpendicular to busbars). Specifically, in the transversal filter, the electrode fingers are structured so that a plurality of lobes (main lobe and side lobes) are formed in a propagation direction of an elastic wave and phases of the elastic wave in the lobes are inverse to each other. On the other hand, in the tapered filter, a plurality of lobes are not formed in many cases unlike the transversal filter, and accordingly, the impedance often becomes lower than that of the transversal filter.

At this time, the low impedance makes the matching in the matching circuit difficult, and as a result, an insertion loss becomes large or a favorable (large) attenuation amount cannot be obtained outside a passband. Therefore, in such a tapered filter, the impedance is desirably increased, and a concrete example of a method for increasing the impedance is to narrow a separation distance between busbars facing each other. However, if an effort is made to narrow the separation distance without narrowing a passband of the filter, the electrode fingers are connected to the busbars at a large angle (lie down), which results in large diffraction and refraction of the elastic wave. Patent Document 1 describes a filter in which the aforesaid transversal filters are disposed in pair and these filters are connected in parallel between ports, but it does not consider the tapered filter.

[Patent Document 1] Japanese Patent Application Laid-open No. 2005-102119 (FIG. 1)
[Patent Document 2] Japanese Patent Application Laid-open No. 2006-311180

SUMMARY OF THE INVENTION

The present invention was made in consideration of the above circumstances, and has an object to provide an elastic wave filter in which input-side IDT electrodes and output-side IDT electrodes each in a tapered shape are disposed on a piezoelectric substrate and whose impedance can be made higher than that of a conventional filter in which one input-side IDT electrode and one output-side IDT electrode are disposed.

An elastic wave filter of the present invention includes a first filter part and a second filter part in each of which tapered IDT electrodes each including a plurality of electrode fingers and a pair of busbars are disposed as an input-side electrode and an output-side electrode on a piezoelectric substrate so as to be apart from each other in a propagation direction of an elastic wave, wherein the input-side electrode of the first filter part and the input-side electrode of the second filter part are arranged in a direction perpendicular to the propagation direction of the elastic wave, and the output-side electrode of the first filter part and the output-side electrode of the second filter part are arranged in the direction perpendicular to the propagation direction of the elastic wave, wherein the input-side electrode of the first filter part and the input-side electrode of the second filter part have the same structure, and the output-side electrode of the first filter part and the output-side electrode of the second filter part have the same structure, wherein an upper busbar in the input-side electrode of the first filter part and a lower busbar in the input-side electrode of the second filter part are electrically connected to each other, where the upper busbar and the lower busbar are busbars located on an upper side and on a lower side in the respective input-side electrodes when the input-side electrode of the first filter part is disposed on the lower side and the input-side electrode of the second filter part is disposed on the upper side of the input-side electrode of the first filter part, wherein an upper busbar in the output-side electrode of the first filter part and a lower busbar in the output-side electrode of the second filter part are electrically connected to each other, where the upper busbar and the lower busbar are busbars located on an upper side and on a lower side in the respective output-side electrodes when the output-side electrode of the first filter part is disposed on the lower side and the output-side electrode of the second filter part is disposed on the upper side of the output-side electrode of the first filter part, wherein the lower busbar of the input-side electrode of the first filter part and the upper busbar of the input-side electrode of the second filter part are connected to one and the other of an input port and a ground port respectively, and wherein the lower busbar of the output-side electrode of the first filter part and the upper busbar of the output-side electrode of the second filter part are connected to one and the other of an output port and a ground port respectively.

The upper busbar in the input-side electrode of the first filter part and the lower busbar in the input-side electrode of the second filter part may be common, and the upper busbar in the output-side electrode of the first filter part and the lower busbar in the output-side electrode of the second filter part may be common.

Further, the lower busbar in the input-side electrode of the first filter part and the upper busbar in the input-side electrode of the second filter part may be connected to one and the other of a pair of balanced input ports respectively instead of being connected to one and the other of the input port and the ground port respectively, the lower busbar in the output-side electrode of the first filter part and the upper busbar in the output-side electrode of the second filter part may be connected to one and the other of a pair of balanced output ports respectively instead of being connected to one and the other of the output port and the ground port respectively, the input-side electrode of the first filter part and the input-side electrode of the second filter part may be disposed so that a structure of the electrode fingers when the input-side electrode of the first filter part is seen from the upper side and a structure of the electrode fingers when the input-side electrode of the second filter part is seen from the lower side are axisymmetrical to each other, and the output-side electrode of the first filter part and the output-side electrode of the second filter part may be disposed so that a structure of the electrode fingers when the output-side electrode of the first filter part is seen from the upper side and a structure of the electrode fingers when the output-side electrode of the second filter part is seen from the lower side are axisymmetrical to each other.

In the present invention, as for the first filter part and the second filter part in each of which the tapered IDT electrodes are disposed as the input-side electrode and the output-side electrode respectively, their input-side electrodes have the same structure and their output-side electrodes have the same structure. Further, the input-side electrodes are arranged and the output-side electrodes are arranged, in the direction perpendicular to the propagation direction of the elastic wave, and in the respective filter parts, the input-side electrodes are connected and the output-side electrodes are connected, in cascade (in series) between the signal port (the input port or the output port) and the ground port. Therefore, it is possible to increase impedance as compared with a conventional filter in which one input-side electrode and one output-side electrode are disposed.

DETAILED DESCRIPTION OF THE PREFERRED EMBODIMENTS

Figure 1:
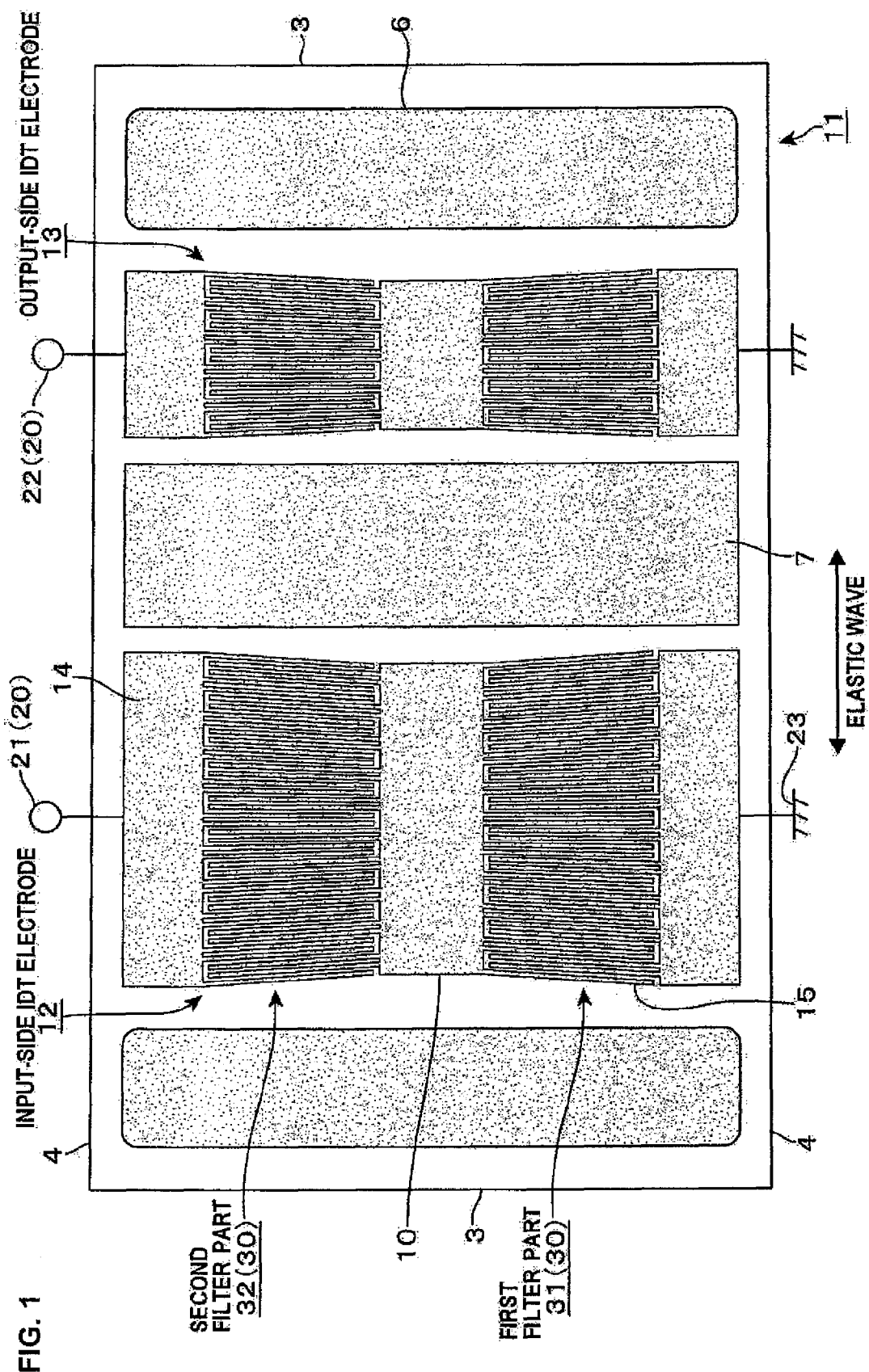
FIG. 1 is a plane view showing an example of an elastic wave filter of the present invention.

An example of an embodiment of the elastic wave filter of the present invention will be described with reference to FIG. 1. This elastic wave filter includes a tapered input-side IDT electrode 12 and a tapered output-side IDT electrode 13 which are arranged apart from each other along a propagation direction of an elastic wave, and these IDT electrodes 12, 13 are formed on a piezoelectric substrate 11 of, for example, lithium niobate or the like. Here, a structure composed of the input-side IDT electrode 12 and the output-side IDT electrode 13 will be called a "filter part 30". In this example, a pair of the filter parts 30 is provided, and these filter parts 30 are arranged along a direction perpendicular to the propagation direction of the elastic wave (a direction along short sides 3, 3 out of four outer edges of the piezoelectric substrate 11).

Further, the propagation direction of the elastic wave (direction along long sides 4, 4 out of the four outer edges of the piezoelectric substrate 11) will be called a left and right direction. The input-side IDT electrodes 12, 12 and the output-side IDT electrodes 13, 13 are disposed on the left and on the right respectively. In FIG. 1, 14 denotes busbars and 15 denotes electrode fingers. In each of the IDT electrodes 12 (13), two electrode fingers 15, 15 extending from the one-side busbar 14 and two electrode fingers 15, 15 extending from the other-side busbar 14 so as to be adjacent to the aforesaid electrode fingers 15, 15 make a set, so that a cycle unit λ corresponding to a wavelength of the elastic wave is repeated along the propagation direction.

Here, one side and the other side of the direction (up and down direction) perpendicular to the propagation direction of the elastic wave will be called a near (lower) side and a far (upper) side respectively. In the near-side filter part 30, the plural electrode fingers 15 are formed so that the cycle unit λ gradually becomes narrower from the near side toward the far side, and in the far-side filter part 30, the plural electrode fingers 15 are formed so that the cycle unit λ gradually widens from the near side toward the far side. Here, a near-side one of the two filter parts 30 will be called a "first filter part 31" and a far-side one will be called a "second filter part 32". The far-side (upper) busbar 14 of the first filter part 31 and the near-side (lower) busbar 14 of the second filter part 32 are common and form a floating electrode 10. That is, the far-side busbar 14 of the first filter part 31 and the near-side busbar 14 of the second filter part 32 are electrically connected to each other.

In the first filter part 31, the near-side busbar 14 of the input-side IDT electrode 12 and the near-side busbar 14 of the output-side IDT electrode 13 are connected to ground ports 23, 23 respectively. Further, in the second filter part 32, the far-side busbar 14 of the input-side IDT electrode 12 is connected to an input port 21 and the far-side busbar 14 of the output-side IDT electrode 13 is connected to an output port 22. Therefore, the filter parts 31, 32 are connected in cascade to each other between the signal ports 20 (the input port 21 or the output port 22) and the ground ports 23.

In the first filter part 31 and the second filter part 32, the input-side IDT electrodes 12, 12 have the same structure and the output-side IDT electrodes 13, 13 have the same structure. Concretely, the input-side IDT electrodes 12, 12 are the same and the output-side IDT electrodes 13, 13 are the same in the pair number of the electrode fingers 15 (the number of sets of the electrode fingers 15, 15 arranged to interlock with each other), a separation distance (aperture length) between the busbars 14, 14, the cycle unit λ from a low-frequency side to a high-frequency side, an arrangement layout of the electrode fingers 15, and so on. Specifically, the arrangement layout of the electrode fingers 15 when the two filter parts 31, 32 are seen from, for example, the near side (to which one of the pair of busbars 14, 14 each of the electrode fingers 15 is connected) is the same in these filter parts 31, 32. In FIG. 1, 6 denotes dampers for absorbing an unnecessary elastic wave propagating to end regions of the piezoelectric substrate 11, and 7 denotes a shield electrode disposed between the IDT electrodes 12, 13 and made of a metal film.

When an electric signal is input to the input port 21 in this filter, elastic waves with the wavelength of the cycle unit λ of each track between the busbars 14, 14 are generated in the input-side IDT electrodes 12, 12 of the filter parts 31, 32. Then, these elastic waves propagate toward the output-side IDT electrodes 13, 13 respectively, the elastic waves are converted to electric signals in the output-side IDT electrodes 13, 13 of the respective filter parts 31, 32, and the electric signals are taken out from the output port 22.

According to the above-described embodiment, the filter parts 31, 32 which are the same in the structure of the input-side IDT electrode 12 and in the structure of the output-side IDT electrode 13 are disposed, and the input-side IDT electrodes 12, 12 are connected and the output-side IDT electrodes 13, 13 are connected, in cascade (in series) between the signal port 20 and the ground port 23. Therefore, the filter of the present invention including the two filter parts 31, 32 apparently has substantially the same frequency characteristic as that of the single filter part 31 (32), but has a higher impedance than when only the single filter part 31 (32) is disposed, by an amount corresponding to the series (cascade) connection of the two filter parts 31, 32. That is, the filter of the present invention can have a higher impedance because it is possible to dispose two interlocking regions of the electrode fingers 15, 15 (regions between the busbars 14, 14), compared with a conventional filter in which one input-side IDT electrode 12 and one output-side IDT electrode 13 are disposed. This makes it possible to increase radiation conductance from the filter and to facilitate the matching in an external matching circuit, enabling a reduction in an insertion loss of the filter and an increase in an attenuation amount outside a passband.

Here, an effort to increase the impedance without narrowing the passband in the structure of the conventional filter results in, for example, narrowing of the separation distance between the busbars 14, 14 facing each other, and accordingly the electrode fingers 15 are connected to the busbars 14 at a large angle (lie down). Consequently, the frequency characteristic deteriorates due to the diffraction and refraction of the elastic wave. In the filter of the present invention, on the other hand, since it is not necessary to increase the connection angle in order to increase the impedance, it is possible to reduce the deterioration of the characteristic ascribable to the diffraction and refraction of the elastic wave as well as to increase the impedance.

In FIG. 1, a description is given of an unbalanced structure where the signal ports 20 and the ground ports 23 are provided, but a balanced structure is also adoptable. Concretely, in the input-side IDT electrodes 12, 12, the busbars 14, 14 connected to the signal port 20 and the ground port 23 are connected to one and the other of a pair of balanced input ports (not shown), instead of the signal port 20 and the ground port 23. Further, in the output-side IDT electrodes 13, 13, the busbars 14, 14 connected to the signal port 20 and the ground port 23 are similarly connected to one and the other of a pair of balanced output ports (not shown), instead of the signal port 20 and the ground port 23. In this case as well, the same effects as those of the above-described example can be obtained.

Figure 2:
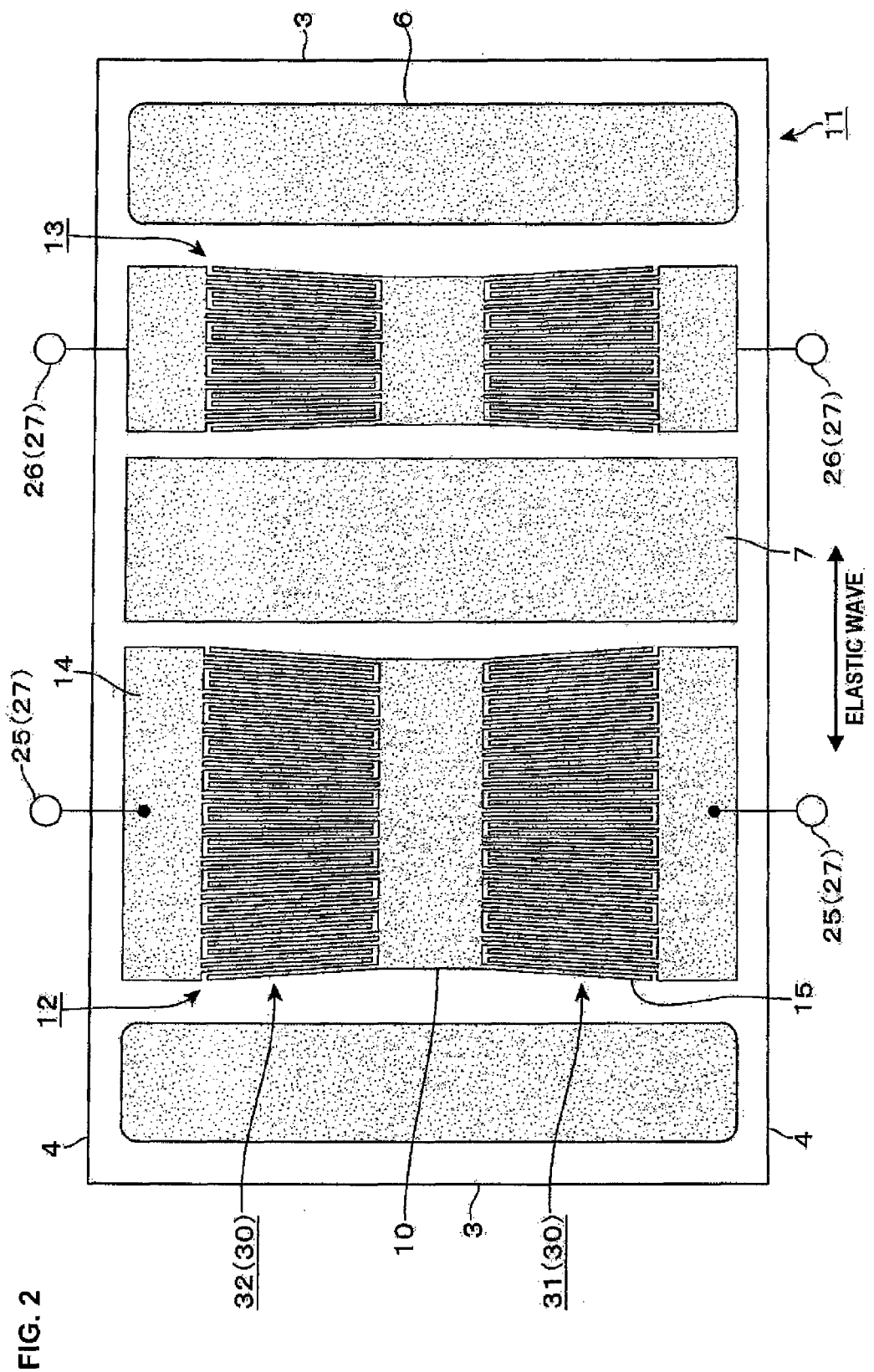
FIG. 2 is a plane view showing another example of the filter.

Here, when the filter is of the balanced type, in the filter parts 31, 32, it is preferable that the near side and the far side of the floating electrode 10 are vertically symmetrical (axisymmetrical) with respect to the floating electrode 10. Concretely, as shown in FIG. 2, a first filter part 31 is formed to have the same structure as that of the above-described first filter part 31 in FIG. 1, and a second filter part 32 is structured so that the electrode fingers 15 in the second filter part 32 in FIG. 1 are disposed as follows. Specifically, the electrode fingers 15 connected to the near-side busbar 14 (floating electrode 10) in FIG. 1 are set apart from the floating electrode 10 and are connected to the far-side busbar 14, and the electrode fingers 15 connected to the far-side busbar 14 in FIG. 1 are set apart from the far-side busbar 14 and are connected to the floating electrode 10. Further, the near-side busbar 14 of the input-side IDT electrode 12 of the first filter part 31 and the far-side busbar 14 of the input-side IDT electrode 12 of the second filter part 32 are connected to one and the other of a pair of balanced input ports 25, 25 respectively. Further, the near-side busbar 14 of the output-side IDT electrode 13 of the first filter part 31 and the far-side busbar 14 of the output-side IDT electrode 13 of the second filter part 32 are connected to one and the other of a pair of balanced output ports 26, 26 respectively.

When the filter parts 31, 32 are thus disposed, the arrangement layout of the electrode fingers 15 when the first filter part 31 is seen from the floating electrode 10 and the arrangement layout of the electrode fingers 15 when the second filter part 32 is seen from the floating electrode 10 are the same. That is, the filter parts 31, 32 are axisymmetrical with respect to the floating electrode 10. Therefore, the filter parts 31, 32 are the same in the structure when the filter part 31 (32) is seen from the balanced port 27 (the balanced input port 25 or the balanced output port 26). Therefore, it is possible to optimize a degree of balance between these balanced ports 27, 27, which further facilitates the matching in the external matching circuit. This can further reduce the insertion loss and can further increase the attenuation amount outside the passband (can realize a higher attenuation).

Even when the filter parts 31, 32 are disposed axisymmetrically with respect to the floating electrode 10 as shown in FIG. 2, the filter may be of the unbalanced type, with the signal ports 20 and the ground ports 23 disposed as in FIG. 1. Note that in FIG. 2, portions having the same structure as those in FIG. 1 are denoted by the same reference signs as those in FIG. 1 and a description thereof is omitted.

Figure 3:
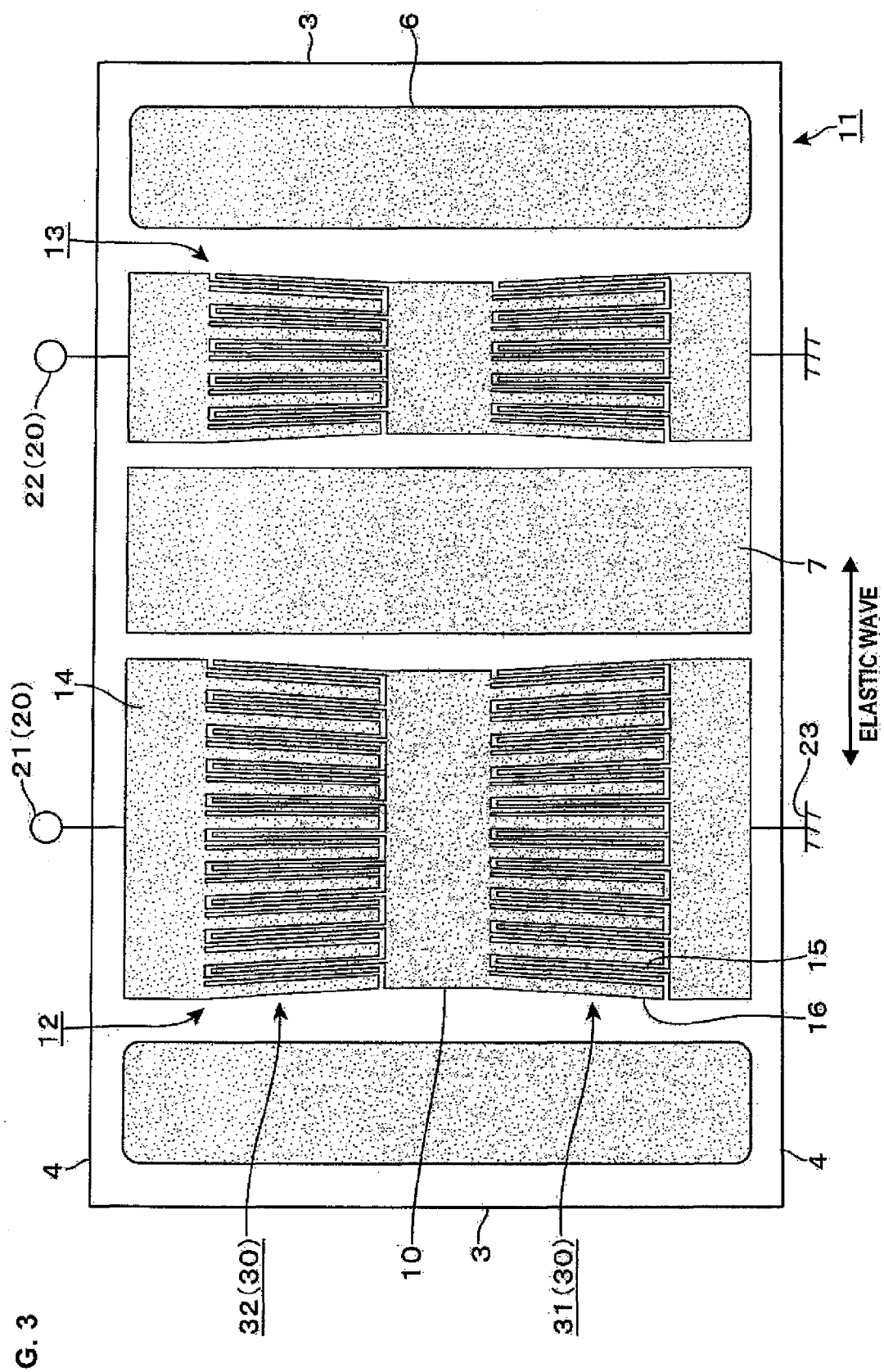
FIG. 3 is a plane view showing another example of the filter.

Further, in each of the filter parts 31, 32, reflecting electrodes 16 may be disposed in addition to the electrode fingers 15. FIG. 3 shows an example where the reflecting electrodes 16 extending from one-side busbar 14 (the floating electrode 10 in the first filter part 31, and the far-side busbar 14 in the second filter part 32) each is disposed so as to be adjacent to the set of electrode fingers 15, 15 which extend from the one-side busbar 14 and the other-side busbar 14 respectively to interlock with each other. Therefore, in this filter, the arrangement pattern of the electrode fingers 15, 15 and the reflecting electrode 16 is periodically repeated in the propagation direction of the elastic wave to form a DART (Distributed Acoustic Reflection Transducer) electrode among unidirectional electrodes.

In FIG. 3, the filter is structured as the unbalanced type, with the signal ports 20 and the ground ports 23 provided as in the above-described FIG. 1. In this example as well, the filter may be of the balanced type, with the balanced ports 27 being connected to the busbars 14 of the IDT electrodes 12, 13 as in FIG. 2.

Figure 4:
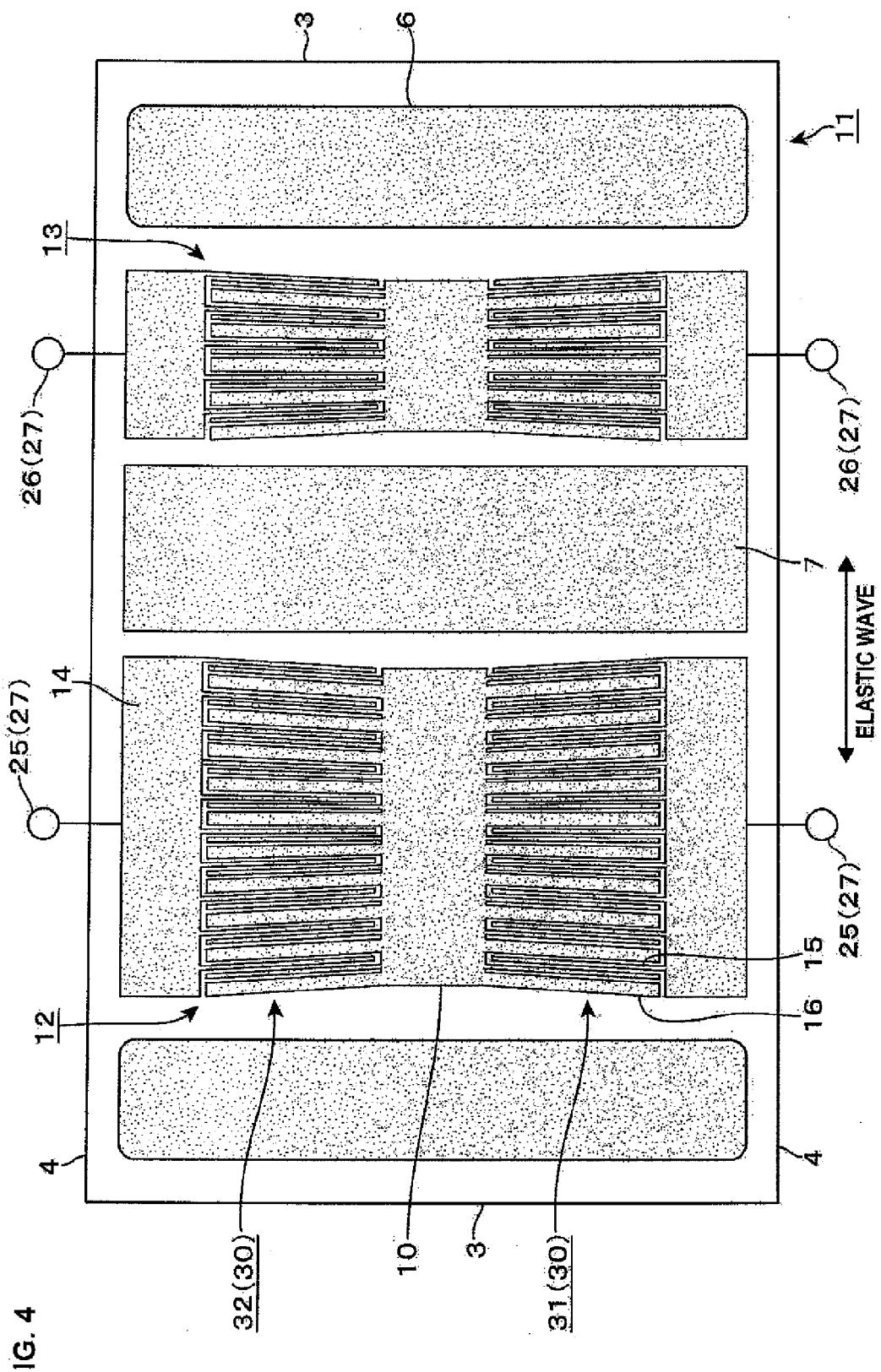
FIG. 4 is a plane view showing another example of the filter.

Further, when the balanced filter is structured with the reflecting electrodes 16 being disposed as in FIG. 3 and the balanced ports 27 being disposed, it is preferable that the filter parts 31, 32 are vertically symmetrical with respect to the floating electrode 10 as in the above-described FIG. 2. Concretely, as shown in FIG. 4, in the first filter part 31, the arrangement is the same as that in the first filter part 31 in FIG. 3, and in the second filter part 32, the busbars 14, 14 to which the electrode fingers 15 and the reflecting electrodes 16 are connected in FIG. 3 are exchanged in position. Specifically, the electrode fingers 15 connected to the far-side busbar 14 in the second filter part 32 in FIG. 3 are set apart from this busbar 14 and are connected to the near-side busbar 14 (floating electrode 10). Further, the electrode fingers 15 connected to the floating electrode 10 in the second filter part 32 in FIG. 3 are set apart from the floating electrode 10 and are connected to the far-side busbar 14. Further, the reflecting electrodes 16 are connected to the floating electrode 10 instead of being connected to the far-side busbar 14.

By thus disposing the filter parts 31, 32 so as to be vertically symmetrical with respect to the floating electrode 10, it is possible to improve a degree of balance between the balanced ports 27, 27 as in the above-described FIG. 2, even in the DART structure in which the structure corresponding to one cycle unit λ (the two electrode fingers 15, 15 and the single reflecting electrode 16) is asymmetrical in the left and right direction. This example may also adopt the unbalanced connection, with the signal ports 20 and the ground ports 23 being disposed as in the above-described FIG. 3.

Figure 5:
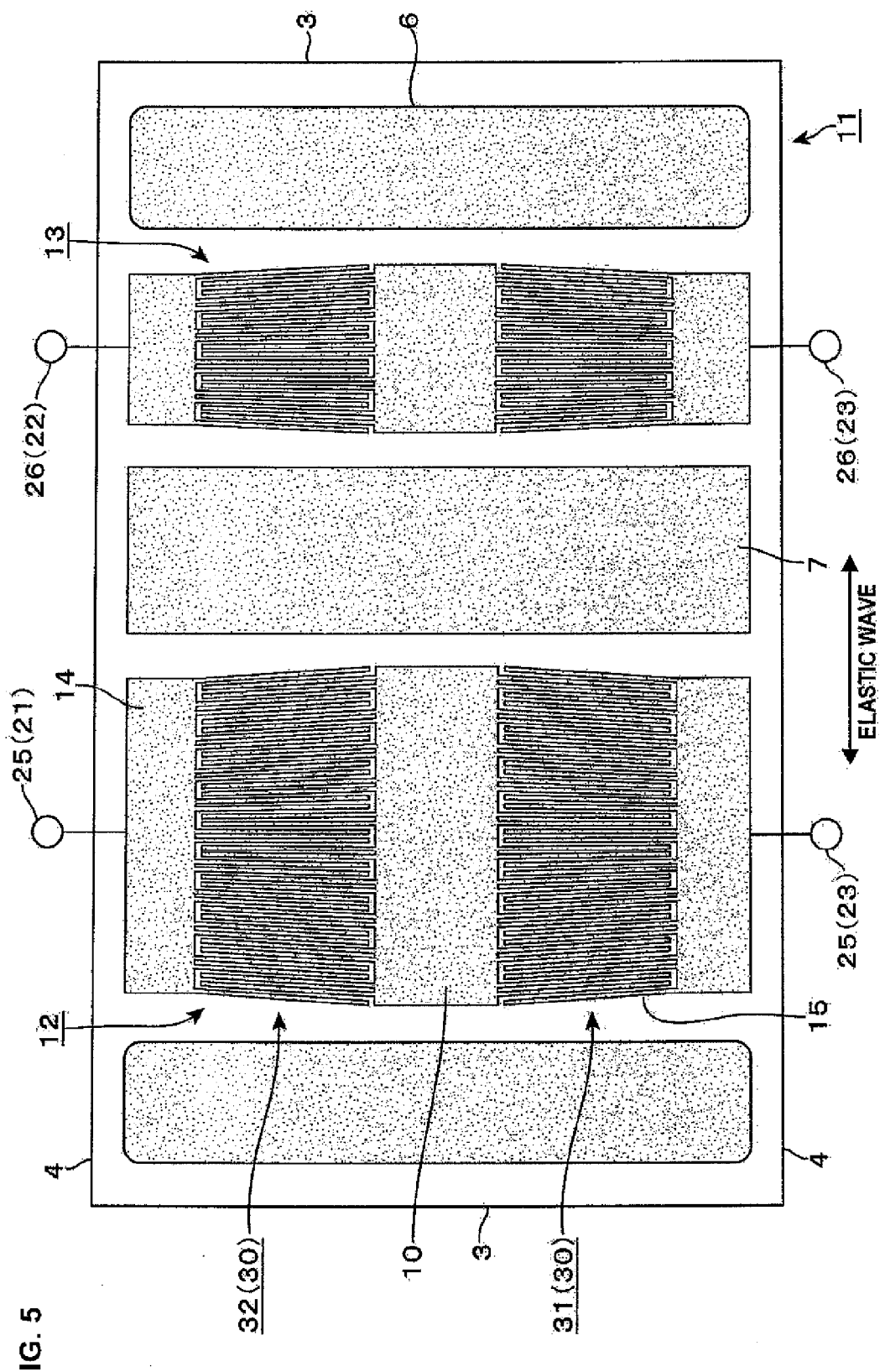
FIG. 5 is a plane view showing another example of the filter.

In the above-described examples, in disposing the floating electrode 10 between the filter parts 31, 32, the busbars 14, 14 on the high-frequency side (low-wavelength side) are connected to each other, but for example, as shown in FIG. 5, the busbars 14, 14 on the low-frequency side (high-wavelength side) may be connected to each other. In FIG. 5, in the first filter part 31, the plural electrode fingers 15 are disposed so that the cycle unit λ becomes wider from the near side toward the far side, and in the second filter part 32, the plural electrode fingers 15 are disposed so that the cycle unit λ narrows from the near side toward the far side. In order to describe such a structure, FIG. 5 shows an example where the filter parts 31, 32 are disposed vertically symmetrically with respect to the floating electrode 10 as in the above-described FIG. 2.

Figure 6:
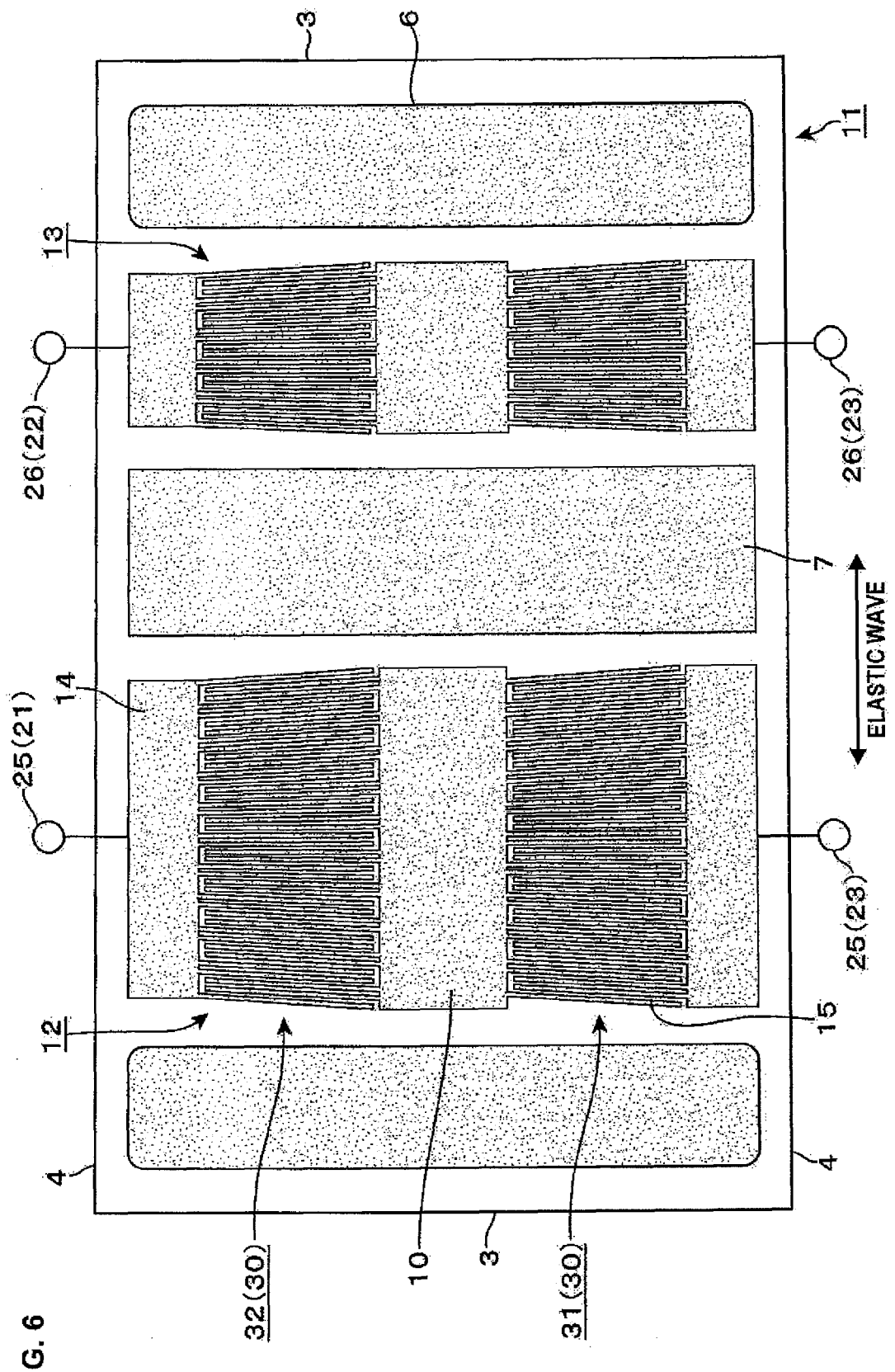
FIG. 6 is a plane view showing another example of the filter.

Further, in connecting the filter parts 31, 32 in cascade, the busbar 14 on the high-frequency side in the first filter part 31 and the busbar 14 on the low-frequency side in the second filter part 32 may be connected to each other via the floating electrode 10 as shown in FIG. 6.

In the above-described FIG. 5 and FIG. 6 as well, the unbalanced connection may be adopted, with the signal ports 20 and the ground ports 23 being disposed, or the balanced connection may be adopted, with the balanced ports 27 being disposed.

Figure 7:
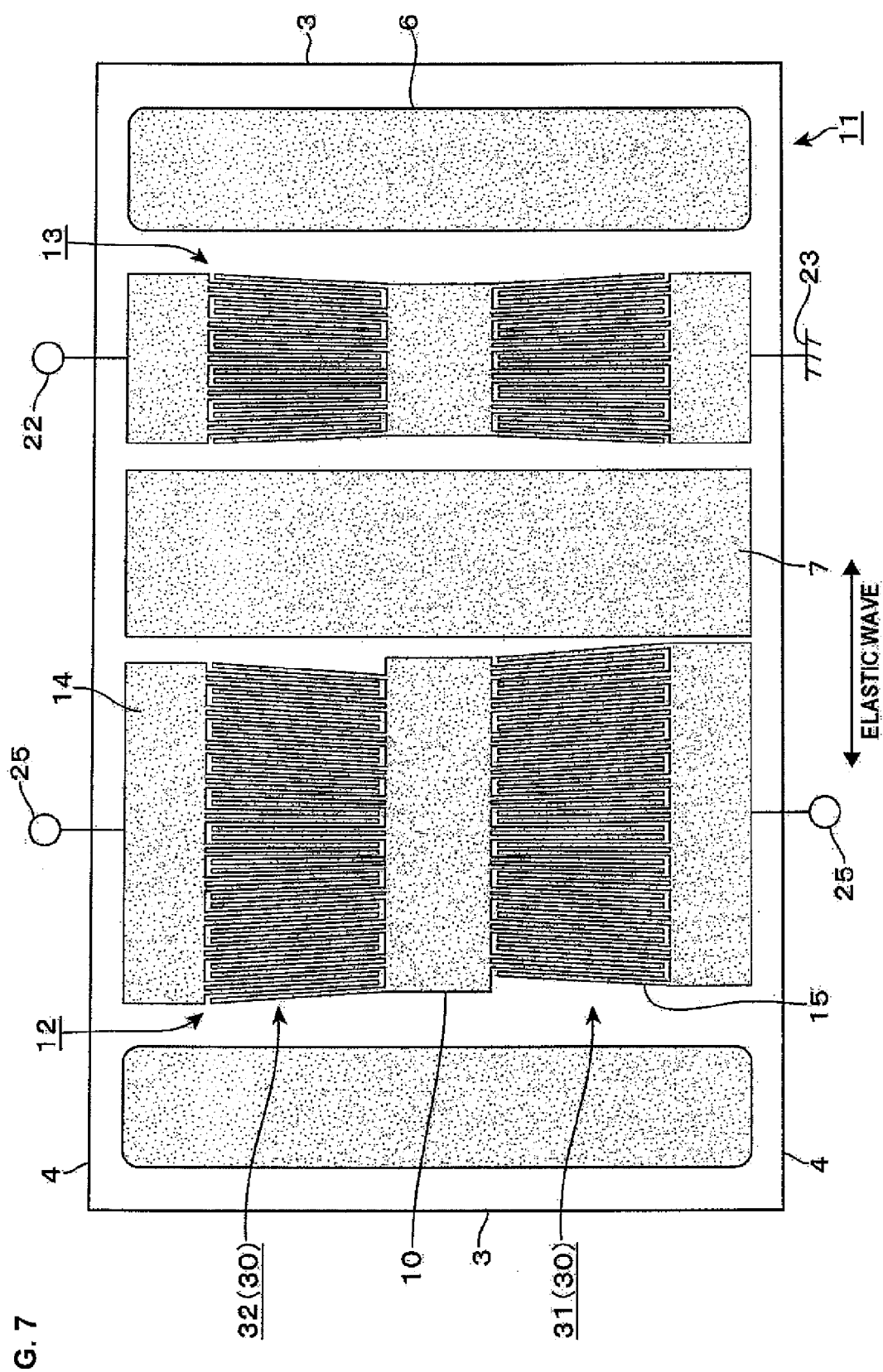
FIG. 7 is a plane view showing another example of the filter.

Also adoptable is a structure in which the balanced ports 27 are disposed for either of the input-side IDT electrodes 12 and the output-side IDT electrodes 13 to form balanced electrodes, and the signal port 20 and the ground port 23 are disposed for the other of the input-side IDT electrodes 12 and the output-side IDT electrodes 13 to form unbalanced electrodes. FIG. 7 shows an example of a filter of such a balanced-unbalanced type. The balanced input ports 25, 25 are connected to the near-side busbar 14 of the input-side IDT electrode 12 of the first filter part 31 and the far-side busbar 14 of the input-side IDT electrode 12 of the second filter part 32 respectively. Further, the ground port 23 is connected to the near-side busbar 14 of the output-side IDT electrode 13 of the first filter part 31, and the output port 22 is connected to the far-side busbar 14 of the output-side IDT electrode 13 of the second filter part 32. In order to prevent phase shift between the elastic waves of the filter parts 31, 32 (in order to equalize polarity), the input-side IDT electrode 12 of one of the filter parts 31, 32, in this example, the first filter part 31, is deviated from the input-side IDT electrode 12 of the second filter part 32 toward the output-side IDT electrode 13 by half the wavelength (cycle unit λ÷2).

In this example, the same effects as those of the above-described examples can be obtained. In FIG. 7, in order to form an unbalanced filter, the signal port 20 and the ground port 23 may be provided for the input-side IDT electrodes 12 and the pair of balanced output ports 26, 26 may be disposed for the output-side IDT electrodes 13.

Figure 8:
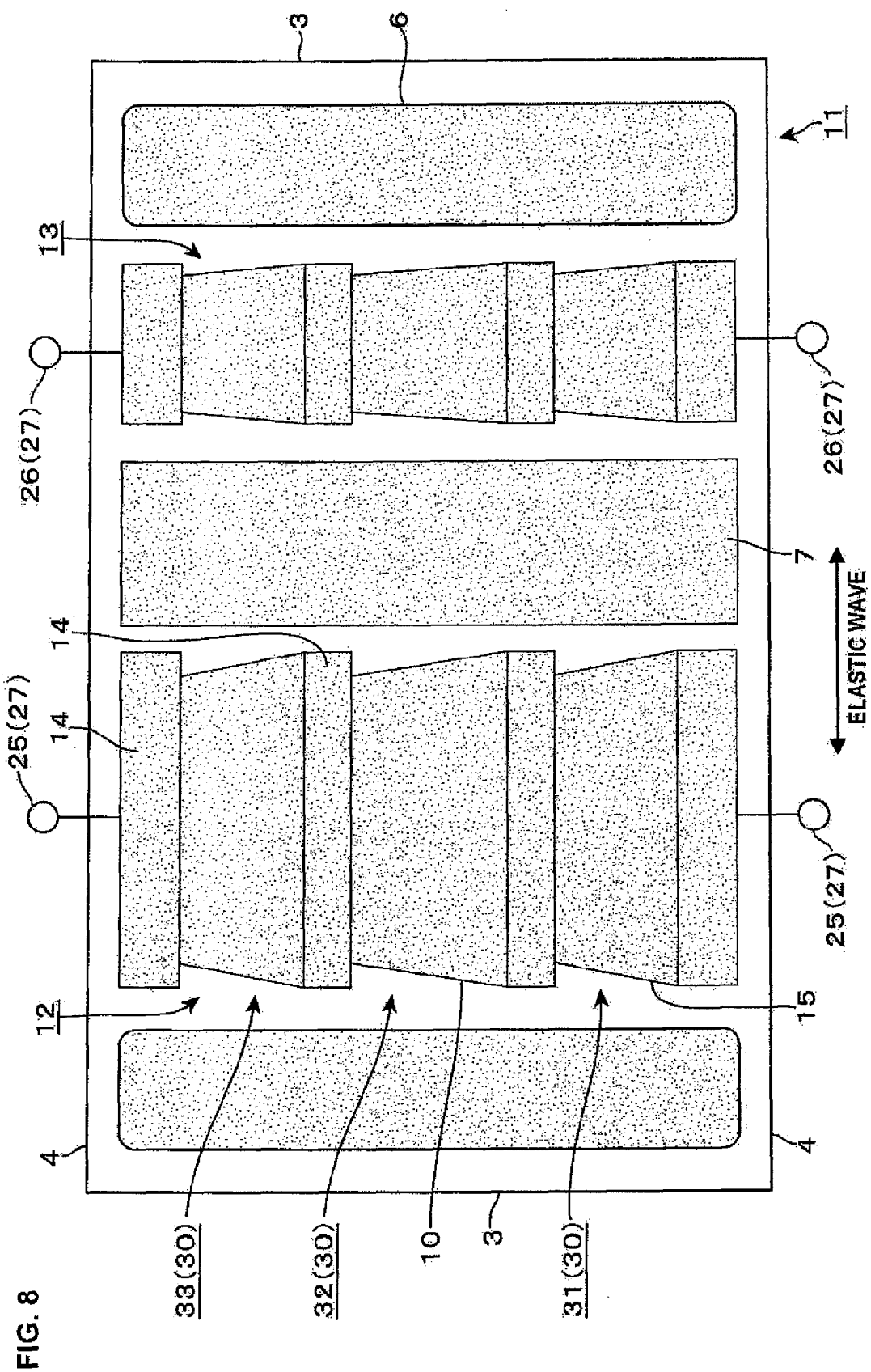
FIG. 8 is a plane view showing another example of the filter.

Further, in the above-described examples, the two filter parts 31, 32 are connected in cascade, but three filter parts 30 or more may be connected in cascade. FIG. 8 shows an example where three filter parts 31, 32, 33 are connected in cascade. In this example, the first filter part 31, the second filter part 32, and the third filter part 33 are disposed in the order mentioned from the near side toward the far side, and in each of the filter parts 31 to 33, the plural electrode fingers 15 are disposed so that the aforesaid cycle unit λ gradually narrows from the near side toward the far side. The far-side busbar 14 of the first filter part 31 and the near-side busbar 14 of the second filter part 32 are made common as the floating electrode 10, and the far-side busbar 14 of the second filter part 32 and the near-side busbar 14 of the third filter part 33 are made common as the floating electrode 10. Further, the balanced input ports 25, 25 are connected to the near-side busbar 14 of the input-side IDT electrode 12 of the first filter part 31 and the far-side busbar 14 of the input-side IDT electrode 12 of the third filter part 33 respectively, and the balanced output ports 26, 26 are connected to the near-side busbar 14 of the output-side IDT electrode 13 of the first filter part 31 and the far-side busbar 14 of the output-side IDT electrode 13 of the third filter part 33 respectively.

By thus connecting the three filter parts 31 to 33 in cascade, it is possible to make the impedance higher than those in the above-described examples. At this time, in FIG. 8 as well, the input-side IDT electrodes 12 and/or the output-side IDT electrodes 13 may be unbalanced electrodes.

In the above-described examples, the terms "first filter part 31", "second filter part 32", and "third filter part 33" are used to refer to the plural filter parts (31 to 33), but these "first", "second", and "third" are only appended for convenience sake, and the arrangement positions of these filters 30 may be counterchanged.

Further, in connecting the plural filter parts 30 in cascade, the busbars 14, 14 facing each other in the one filter part 30 and the other filter part 30 adjacent to this filter part 30 out of the plural filter parts 30 are made common as the floating electrode 10, but these busbars 14, 14 may be separated from each other, and a conductive path drawn on the piezoelectric substrate 11 or a wire disposed via a region above the piezoelectric substrate 11 (neither is shown) may be used for connecting the busbars 14, 14. Further, instead of linearly disposing the electrode fingers 15 and the reflecting electrodes 16, the electrode fingers 15 and the reflecting electrodes 16 may be formed so that the cycle unit λ widens (or narrows) in a curved form or stepwise to form a so-called pseudo tapered shape.

What is claimed is:

1. An elastic wave filter comprising:
    a first filter part and a second filter part each having tapered IDT electrodes including a plurality of electrode fingers and a pair of busbars which are disposed as an input-side electrode and an output-side electrode on a piezoelectric substrate so as to be apart from each other in a propagation direction of an elastic wave;
    wherein the input-side electrode of the first filter part and the input-side electrode of the second filter part are arranged in a direction perpendicular to the propagation direction of the elastic wave, and the output-side electrode of the first filter part and the output-side electrode of the second filter part are arranged in the direction perpendicular to the propagation direction of the elastic wave;
    wherein, when the first filter part is placed at a lower side and the second filter part is placed at an upper side of the first filter part, an upper busbar of the pair of busbars is positioned at the upper side in each of the first filter part and second filter part and a lower busbar of the pair of busbars is positioned at the lower side for both the first filter part and the second filter part, and the input-side electrode and the output-side electrode of the first filter part are structured by the plurality of electrode fingers such that a cycle unit λ becomes smaller toward the upper busbar from the lower busbar, and the input-side electrode and the output-side electrode of the second filter part are structured by the plurality of electrode fingers such that the cycle unit λ becomes larger toward the upper busbar from the lower busbar;

wherein a distance between the pair of busbars of the first filter part and a distance between the pair of busbars of the second filter part are the same;

wherein said cycle unit λ becomes smaller towards the upper busbar of said first filter part in a same relationship as said cycle unit λ becomes larger toward the upper busbar for said second filter part for any position along the plurality of electrode fingers of the first filter part and a corresponding position along the second filter part;

wherein the upper busbar in the input-side electrode of the first filter part and the lower busbar in the input-side electrode of the second filter part are electrically connected to each other;

wherein the upper busbar in the output-side electrode of the first filter part and the lower busbar in the output-side electrode of the second filter part are electrically connected to each other;

wherein one of the lower busbar in the input-side electrode of the first filter part and the upper busbar in the input-side electrode of the second filter part connected to one a first input port and a first ground port, and another of the lower busbar in the input-side electrode of the first filter part and the upper busbar in the input-side electrode of the second filter part is connected to another of the first input port and the first ground port; and wherein one of the lower busbar in the output-side electrode of the first filter part and the upper busbar in the output-side electrode of the second filter part is connected to one a second output port and a second ground port, and another of the lower busbar in the output-side electrode of the first filter part and the upper busbar in the output-side electrode of the second filter part is connected to another of the second output port and the second ground port.

2. The elastic wave filter according to claim 1, wherein the upper busbar in the input-side electrode of the first filter part and the lower busbar in the input-side electrode of the second filter part are in common, and the upper busbar in the output-side electrode of the first filter part and the lower busbar in the output-side electrode of the second filter part are in common.

3. An elastic wave filter comprising:

a first filter part and a second filter part each having tapered IDT electrodes including a plurality of electrode fingers and a pair of busbars which are disposed as an input-side electrode and an output-side electrode on a piezoelectric substrate so as to be apart from each other in a propagation direction of an elastic wave;

wherein the input-side electrode of the first filter part and the input-side electrode of the second filter part are arranged in a direction perpendicular to the propagation direction of the elastic wave, and the output-side electrode of the first filter part and the output-side electrode of the second filter part are arranged in the direction perpendicular to the propagation direction of the elastic wave;

wherein, when the first filter part is placed at a lower side and the second filter part is placed at an upper side of the first filter part, an upper busbar of the pair of busbars is positioned at the upper side in each of the first filter part and second filter part and a lower busbar of the pair of busbars is positioned at the lower side for both the first filter part and the second filter part, and the input-side electrode and the output-side electrode of the first filter part are structured by the plurality of electrode fingers such that a cycle unit λ becomes smaller toward the upper busbar from the lower busbar, and the input-side electrode and the output-side electrode of the second filter part are structured by the plurality of electrode fingers such that the cycle unit λ becomes larger toward the upper busbar from the lower busbar;

wherein a structural shape and orientation of the plurality of electrode fingers for the input-side electrode of the first filter part from the lower busbar to the upper busbar of the first filter part is the same as a structure shape and orientation of the plurality of electrode fingers for the input-side electrode of the second filter part from the lower busbar to the upper busbar of the second filter part;

wherein a structural shape and orientation of the plurality of electrode fingers for the output-side electrode of the first filter part from the lower busbar to the upper busbar of the first filter part is the same as a structure shape and orientation of the plurality of electrode fingers for the output-side electrode of the second filter part from the lower busbar to the upper busbar of the second filter part;

wherein the upper busbar in the input-side electrode of the first filter part and the lower busbar in the input-side electrode of the second filter part are electrically connected to each other;

wherein the upper busbar in the output-side electrode of the first filter part and the lower busbar in the output-side electrode of the second filter part are electrically connected to each other;

wherein one of the lower busbar in the input-side electrode of the first filter part and the upper busbar in the input-side electrode of the second filter part connected to one a first input port and a first ground port, and another of the lower busbar in the input-side electrode of the first filter part and the upper busbar in the input-side electrode of the second filter part is connected to another of the first input port and the first ground port; and wherein one of the lower busbar in the output-side electrode of the first filter part and the upper busbar in the output-side electrode of the second filter part is connected to one a second output port and a second ground port, and another of the lower busbar in the output-side electrode of the first filter part and the upper busbar in the output-side electrode of the second filter part is connected to another of the second output port and the second ground port.

4. An elastic wave filter comprising:

a first filter part and a second filter part each having tapered IDT electrodes including a plurality of electrode fingers and a pair of busbars which are disposed as an input-side electrode and an output-side electrode on a piezoelectric substrate so as to be apart from each other in a propagation direction of an elastic wave;

wherein the input-side electrode of the first filter part and the input-side electrode of the second filter part are arranged in a direction perpendicular to the propagation direction of the elastic wave, and the output-side electrode of the first filter part and the output-side electrode of the second filter part are arranged in the direction perpendicular to the propagation direction of the elastic wave;

wherein, when the first filter part is placed at a lower side and the second filter part is placed at an upper side of the first filter part, with the busbar of the pair of busbars that is positioned at the upper side in each of the first filter part and second filter part called the upper busbar and the other busbar of the pair positioned at the lower side called the lower busbar for both the first filter part and the second filter part, the input-side electrode and the output-side electrode of the first filter part are structured by the plurality of electrode fingers such that a cycle unit $\lambda$ becomes smaller toward the upper busbar from the lower busbar, and the input-side electrode and the output-side electrode of the second filter part are structured by the plurality of electrode fingers such that the cycle unit $\lambda$ becomes larger toward the upper busbar from the lower busbar;

wherein a structural shape of the plurality of electrode fingers for the input-side electrode of the first filter part from the lower busbar to the upper busbar of the first filter part is the same as a structure shape of the plurality of electrode fingers for the input-side electrode of the second filter part from the lower busbar to the upper busbar of the second filter part, except for an orientation by which the plurality of electrodes fingers inclines;

wherein a structural shape of the plurality of electrode fingers for the output-side electrode of the first filter part from the lower busbar to the upper busbar of the first filter part is the same as a structure shape of the plurality of electrode fingers for the output-side electrode of the second filter part from the lower busbar to the upper busbar of the second filter part, except for an orientation by which the plurality of electrodes fingers inclines;

wherein the upper busbar in the output-side electrode of the first filter part and the lower busbar in the output-side electrode of the second filter part are electrically connected to one and the other;

wherein one of the lower busbar in the input-side electrode of the first filter part and the upper busbar in the input-side electrode of the second filter part connected to one a first input port and a first ground port, and another of the lower busbar in the input-side electrode of the first filter part and the upper busbar in the input-side electrode of the second filter part is connected to another of the first input port and the first ground port; and wherein one of the lower busbar in the output-side electrode of the first filter part and the upper busbar in the output-side electrode of the second filter part is connected to one a second output port and a second ground port, and another of the lower busbar in the output-side electrode of the first filter part and the upper busbar in the output-side electrode of the second filter part is connected to another of the second output port and the second ground port.

5. The elastic wave filter according to claim 4, wherein the upper busbar in the input-side electrode of the first filter part and the lower busbar in the input-side electrode of the second filter part are in common, and the upper busbar in the output-side electrode of the first filter part and the lower busbar in the output-side electrode of the second filter part are in common.

* * * * *